(12) United States Patent
Yang et al.

(10) Patent No.: US 10,553,753 B2
(45) Date of Patent: Feb. 4, 2020

(54) PATTERNED SUBSTRATE FOR LIGHT EMITTING DIODE

(71) Applicant: Good Mass International Co., Ltd., Hsinchu (TW)

(72) Inventors: Jih-Cheng Yang, Hsinchu (TW); R-Hau Yang, Hsinchu (TW)

(73) Assignee: Good Mass International Co., Ltd., Hsinchu (TW)

( * ) Notice: Subject to any disclaimer, the term of this patent is extended or adjusted under 35 U.S.C. 154(b) by 195 days.

(21) Appl. No.: 15/229,062

(22) Filed: Aug. 4, 2016

(65) Prior Publication Data

US 2017/0045205 A1 Feb. 16, 2017

(30) Foreign Application Priority Data

Aug. 12, 2015 (TW) .............................. 104126193 A

(51) Int. Cl.
*F21V 19/00* (2006.01)
*H01L 33/20* (2010.01)

(52) U.S. Cl.
CPC .................................... *H01L 33/20* (2013.01)

(58) Field of Classification Search
CPC ................................ H01L 33/20; H01L 33/22
See application file for complete search history.

(56) References Cited

U.S. PATENT DOCUMENTS

| 2011/0210368 A1* | 9/2011 | Jeong ............... B29D 11/00009 257/98 |
| 2013/0285098 A1* | 10/2013 | Lin ........................ H01L 33/22 257/98 |
| 2014/0177277 A1* | 6/2014 | Wang He .......... G02F 1/133604 362/619 |
| 2014/0367693 A1 | 12/2014 | Peng | |

FOREIGN PATENT DOCUMENTS

| CN | 102683532 A | 9/2012 |
| CN | 102194940 A | 12/2014 |
| TW | 201440251 A | 10/2014 |
| TW | M500994 | 5/2015 |
| TW | M514654 | 12/2015 |

* cited by examiner

*Primary Examiner* — Laura A Auer
(74) *Attorney, Agent, or Firm* — Penilla IP, APC

(57) ABSTRACT

This invention relates to a patterned substrate for light emitting diode. The patterned substrate includes a surface having a plurality of protrusive structures, wherein each of the protrusive structures includes an upper portion and a lower portion. The surface of the lower portion is a conical surface, and has at least one first zone and at least one second zone. The first zone and the second zone are alternately arranged, wherein the first zone has one or more first projections.

19 Claims, 12 Drawing Sheets

# PATTERNED SUBSTRATE FOR LIGHT EMITTING DIODE

CLAIM OF PRIORITY

This application claims the priority benefit of Taiwanese Application Ser. No. TW104126193, filed on Aug. 12, 2015. All disclosure of the Taiwanese application is incorporated herein by reference.

FIELD

The present invention relates to a substrate for light emitting diode, especially to a patterned substrate for light emitting diode.

BACKGROUND

Light emitting diodes are commonly used in various kinds of daily life products and applications such as illuminations, signal indicators, displays, computers, etc. Light emitting diodes transform electricity into light through combination of electrons and holes. Since the light emitted from light emitting diodes is luminescence, light emitting diodes have many advantages such as energy saving, fast response, no idling time needed, long life time, etc. Moreover, light emitting diodes are small in volume, have good impact resistivity, and may be mass produced by semiconductor manufacturing processes, so it is easy to fabricate small-sized or array-type devices in demands.

In recent years, energy issues have grown worse and worse and the whole world has put great effort into energy saving and carbon reduction, so it is a goal for industries to promote light extraction efficiency of light emitting diodes. In a perfect light emitting diode, the light generated by combination of electrons and holes may completely radiate to an external environment, achieving a light extraction efficiency of 100%. However, in fact, the internal structure and materials of a light emitting diode may lead to various light propagation loss, thus light can't completely radiate to an external environment and light extraction efficiency is reduced.

In order to promote light extraction efficiency of a light emitting diode, industries have already developed patterned sapphire substrates (PSSs) for light emitting diodes. Such patterned sapphire substrates may scatter light and reduce total reflection within the substrates so as to increase possibility of light radiating to an external environment and promote light extraction efficiency of light emitting diodes. However, the conventional patterned sapphire substrates still can't provide sufficient light extraction efficiency for light emitting diodes. Therefore, a patterned substrate for light emitting diode to further improve light extraction efficiency for light emitting diode is extremely needed.

SUMMARY

In view of this, a patterned substrate for light emitting diode is provided according to one embodiment of the present invention. The patterned substrate includes a surface having a plurality of protrusive structures, wherein each of the protrusive structures includes an upper portion and a lower portion. The surface of lower portion is a conical surface, and has at least one first zone and at least one second zone. The first zone and the second zone are alternately arranged, wherein the first zone has one or more first projections.

Other aspects and advantages of the present invention will become apparent from the following detailed description in conjunction with the accompanying drawings for illustrating principles and examples of the present invention. In addition, well-known components and principles have not been described in detail to not unnecessarily obscure the present invention.

BRIEF DESCRIPTION OF THE DRAWINGS

In the drawings, similar or the same components are designated by the same numerals. Furthermore, the drawings are exemplary and illustrative so they are not drawn in real scale.

DETAILED DESCRIPTION

Figure 1:
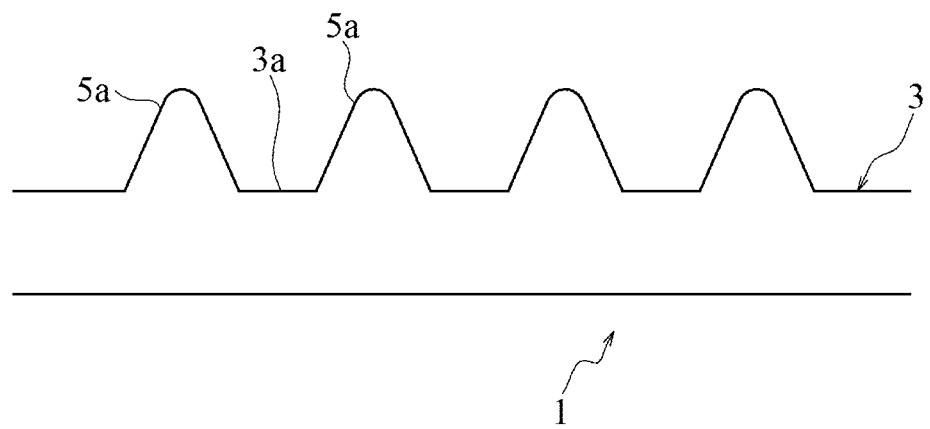
FIG. 1 illustrates a portion of the patterned substrate according to one embodiment of the present invention.

FIG. 1 illustrates a portion of the patterned substrate according to one embodiment of the present invention. As shown in FIG. 1, the patterned substrate 1 comprises a surface 3 having a plurality of protrusive structures 5a formed by etching and/or depositing processes. The patterned substrate for example may be a sapphire substrate or a silicon substrate, but is not limited thereto. On the patterned substrate 1, the protrusive structures 5a may be arranged uniformly or in a certain way such as alternatively. In one embodiment of the present invention, a substrate surface 3a sandwiched between two adjacent protrusive structures 5a may be a flat surface in order to provide an initial surface configured for a subsequent epitaxial growth for forming the light emitting diode.

Various embodiments of the protrusive structures shown in FIG. 1 are explained in detail in the following descriptions.

Figure 2A:
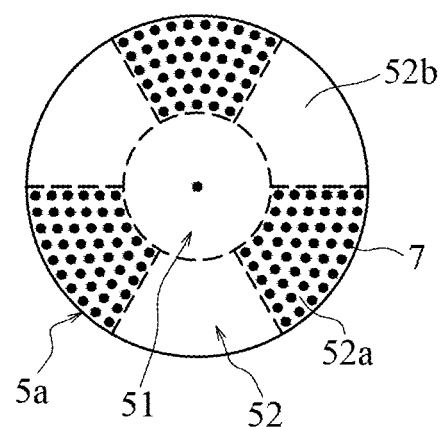
FIG. 2A is a schematic top view of the protrusive structures according to one embodiment of the present invention.
Figure 2B:
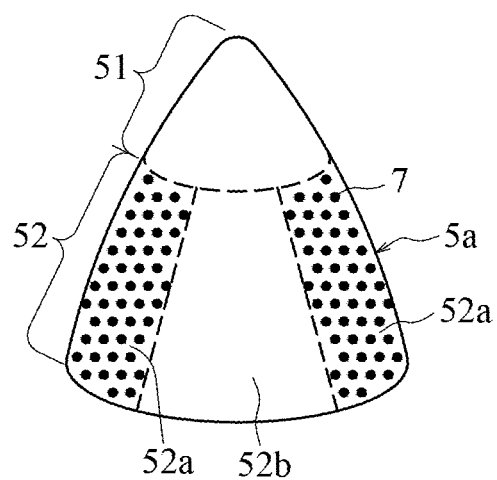
FIG. 2B is a schematic side view of the protrusive structures shown in FIG. 2A.

FIG. 2A is a schematic top view of the protrusive structures 5a according to one embodiment of the present invention. FIG. 2B is a schematic side view of the protrusive structures 5a shown in FIG. 2A. As shown in FIGS. 2A and 2B, each protrusive structure 5a may comprise an upper portion 51 and a lower portion 52. The surface of the lower portion 52 may be a conical surface and has at least one first zone 52a and at least one second zone 52b. The first zones 52a and the second zones 52b are alternately arranged, wherein the first zone 52a has one or more first projections 7. In one embodiment, the first projection 7 is circular with a diameter between 20 nm and 200 nm. In one embodiment, the surface of the upper portion is a conical surface.

Figure 3A:
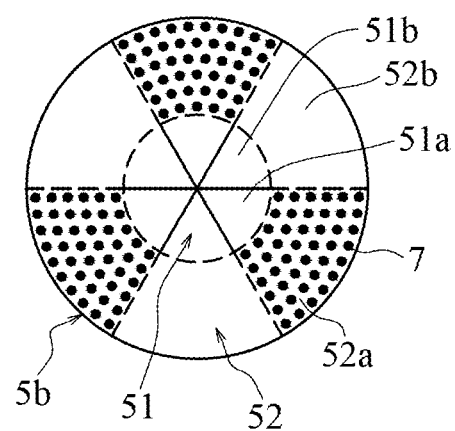
FIG. 3A is a schematic top view of the protrusive structures according to another embodiment of the present invention.
Figure 3B:
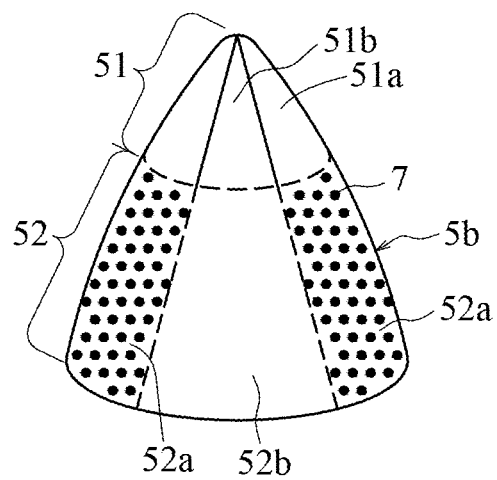
FIG. 3B is a schematic side view of the protrusive structures shown in FIG. 3A.

FIG. 3A is a schematic top view of the protrusive structures 5b according to another embodiment of the present invention. FIG. 3B is a schematic side view of the protrusive structures 5b shown in FIG. 3A. The protrusive structure 5b shown in FIGS. 3A and 3B is a modification of the protrusive structure 5a shown in FIGS. 2A and 2B and is distinguished by the upper portion 51 of the protrusive structure 5b. The upper portion 51 of the protrusive structure 5b shown in FIGS. 3A and 3B is formed by alternatively arranging three third zones 51a and three fourth zones 51b. For example, in this embodiment the third zones 51a of the upper portion 51 correspond to the first zones 52a of the lower portion 52 while the fourth zones 51b of the upper portion 51 correspond to the second zones 52b of the lower portion 52, but the present invention is not limited thereto. For example, in this embodiment the third zone 51a may be an arc surface while the fourth zone 51b may be a flat surface. The arrangement for such arc surface and flat surface may help the light emitted by the light emitting diode propagate to an external environment, thereby promoting light extraction efficiency of the light emitting diode.

Figure 4:
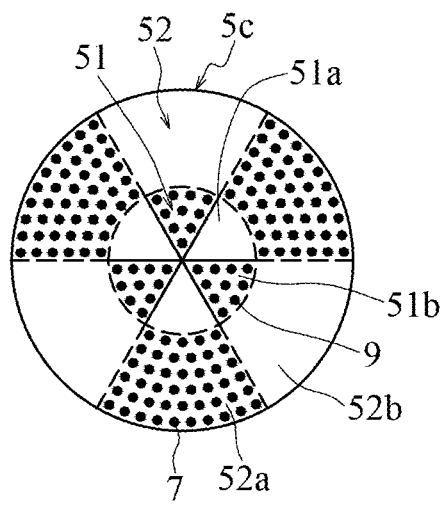
FIG. 4 is a schematic top view of the protrusive structures according to yet another embodiment of the present invention.

FIG. 4 is a schematic top view of the protrusive structures 5c according to yet another embodiment of the present invention. The protrusive structure 5c shown in FIG. 4 is a modification of the protrusive structure 5b shown in FIGS. 3A and 3B and is distinguished by the fourth zone 51b of the upper portion 51 of the protrusive structure 5c. The fourth zone 5b of the upper portion 51 of the protrusive structure 5c comprises one or more second projections 9. In one embodiment, the projection 9 for example may be circular with a diameter between 20 nm and 200 nm. As mentioned above, the third zone 51a may for example be an arc surface.

Figure 5:
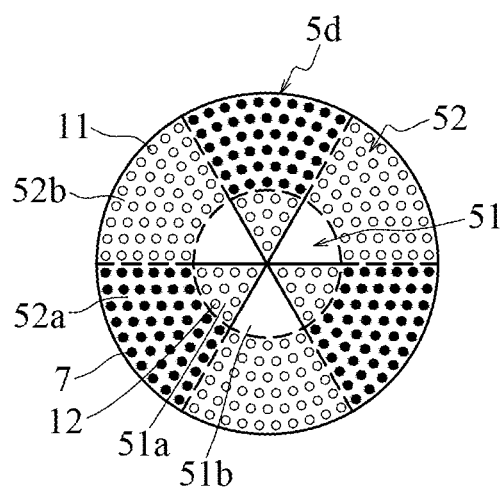
FIG. 5 is a schematic top view of the protrusive structures according to yet another embodiment of the present invention.

FIG. 5 is a schematic top view of the protrusive structures 5d according to yet another embodiment of the present invention. The protrusive structure 5d shown in FIG. 5 is a modification of the protrusive structure 5b shown in FIGS. 3A and 3B and is distinguished by the second zone 52b of the lower portion 52 and the third zone 51a of the upper portion 51 of the protrusive structure 5d. The second zone 52b of the lower portion 52 of the protrusive structure 5d may comprise one or more holes 11 and the third zone 51a of the upper portion 51 of the protrusive structure 5d may comprise one or more holes 12. In one embodiment, the widths of the first hole 11 and the second hole 12 may be less than 0.2 μm, preferably between 10 nm and 100 nm. The first hole 11 and the second hole 12 may take any shapes. For example, in one embodiment, the first hole 11 and the second hole 12 are circular holes and have diameters less than 0.2 μm, preferably between 10 nm and 100 nm. The first hole 11 and the second hole 12 provide more scattering surfaces for helping the light emitted by the light emitting diode propagate to an external environment, thereby promoting light extraction efficiency of the light emitting diode. Again, as mentioned above, the fourth zone 51b may for example be a flat surface.

Figure 6A:
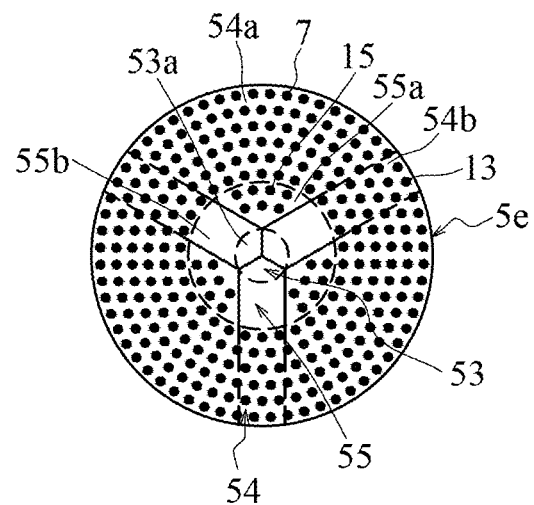
FIG. 6A is a schematic top view of the protrusive structures according to yet another embodiment of the present invention.
Figure 6B:
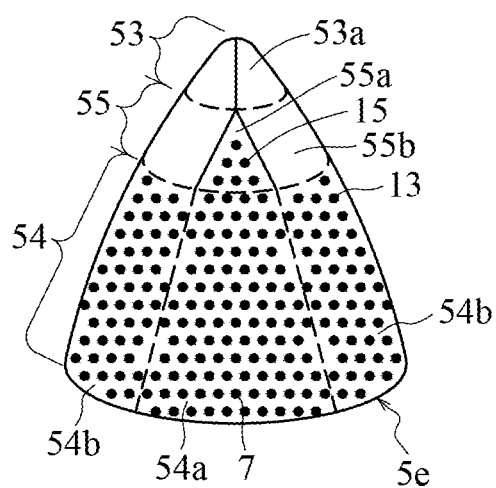
FIG. 6B is a schematic side view of the protrusive structures shown in FIG. 6A.

FIG. 6A is a schematic top view of the protrusive structures 5e according to yet another embodiment of the present invention. FIG. 6B is a schematic side view of the protrusive structures 5e shown in FIG. 6A. As shown in FIGS. 6A and 6B, a surface of the upper portion 53 of the protrusive structure 5e may be a triangular pyramid surface and a surface of the lower portion 54 of the protrusive structure 5e is a conical surface. The surface of the lower portion 54 of the protrusive structure 5e comprises at least one first zone 54a and at least one second zone 54b arranged alternatively. The first zone 54a may comprise one or more first projections 7 while the second zone 54b may comprise one or more third projections 13. Each of the protrusive structures 5e may further comprise an intermediate portion 55 between the upper portion 53 and the lower portion 54. The surface of the intermediate portion 55 may for example be formed by alternatively arranging three fifth zones 55a and three sixth zones 55b. The fifth zone 55a of the intermediate portion 55 comprises one or more fourth projections 15 and corresponds to a first zone 54a of the lower portion 54 while the sixth zone 55b of the intermediate portion 55 corresponds to a second zone 54b of the lower portion 54. In this embodiment, the sixth zone 55b of the intermediate portion 55 may for example be a flat surface. The triangular pyramid surface 53a of the upper portion 53 may be connected to the sixth zone 55b of the intermediate portion 55. In the embodiments of the present invention, the third projections 13 and the fourth projections 15 for example may be circular with a diameter between 20 nm and 200 nm.

Figure 7A:
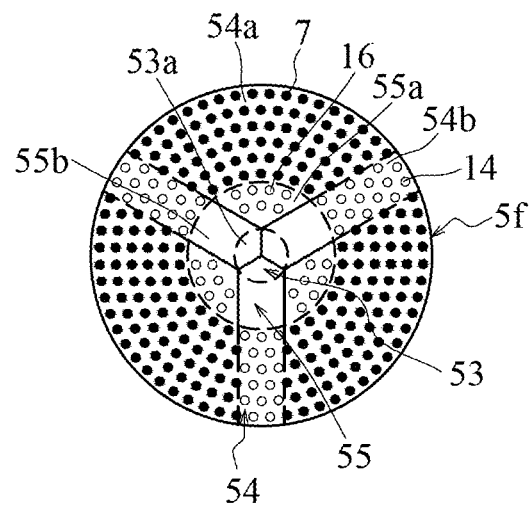
FIG. 7A is a schematic top view of the protrusive structures according to yet another embodiment of the present invention.
Figure 7B:
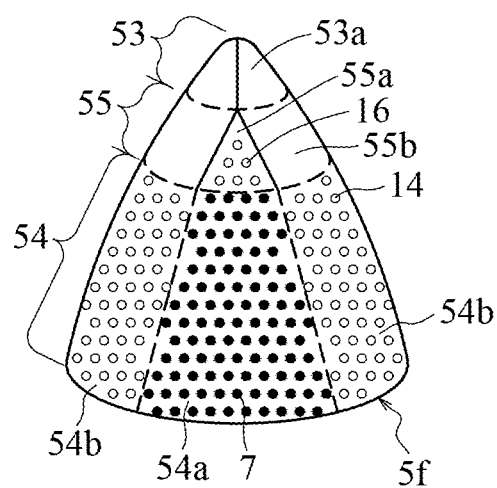
FIG. 7B is a schematic side view of the protrusive structures shown in FIG. 7A.

FIG. 7A is a schematic top view of the protrusive structures 5f according to one embodiment of the present invention. FIG. 7B is a schematic side view of the protrusive structures 5f shown in FIG. 7A. The protrusive structure 5f shown in FIGS. 7A and 7B is a modification of the protrusive structure 5e shown in FIGS. 6A and 6B and is distinguished by the second zone 54b and the fifth zone 55a of the protrusive structure 5f. The second zone 54b of the protrusive structure 5f comprises one or more third holes 14 while the fifth zone 55a of the protrusive structure 5f comprises one or more fourth holes 16. In this embodiment, the sixth zone 55b of the intermediate portion 55 may for example be a flat surface. In the embodiments of the present invention, the third hole 14 and the fourth hole 16 each has a width less than 0.2 μm, preferably between 10 nm and 100 nm. The third hole 14 and the fourth hole 16 may take any shapes. For example, in one embodiment the third holes 14 and the fourth holes 16 are circular holes with a diameter less than 0.2 μm, preferably between 10 nm and 100 nm. The third hole 14 and the fourth hole 16 provide more scattering surfaces for helping the light emitted by the light emitting diode propagate to an external environment, thereby promoting light extraction efficiency of the light emitting diode.

Figure 8A:
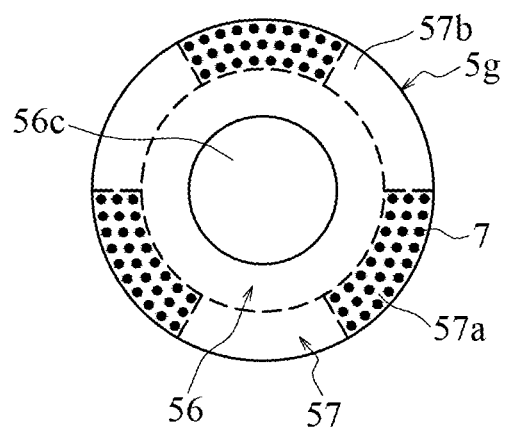
FIG. 8A is a schematic top view of the protrusive structures according to yet another embodiment of the present invention.
Figure 8B:
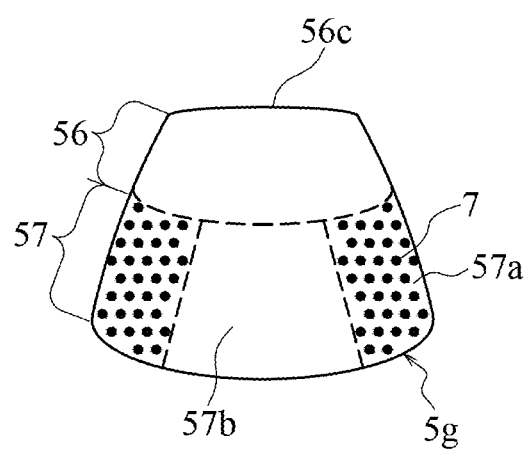
FIG. 8B is a schematic side view of the protrusive structures shown in FIG. 8A.

FIG. 8A is a schematic top view of the protrusive structures 5g according to yet another embodiment of the present invention. FIG. 8B is a schematic side view of the protrusive structures 5g shown in FIG. 8A. As shown in FIGS. 8A and 8B, the upper portion 56 of the protrusive structure 5g may comprise a truncated top surface 56c. The surfaces of the upper portion 56 and the lower portion 57 of the protrusive structure 5g may be conical surfaces. The lower portion 57 may comprise at least one first zone 57a and at least one second zone 57b alternatively arranged. The first zone 57a may comprise one or more first projections 7.

Figure 9A:
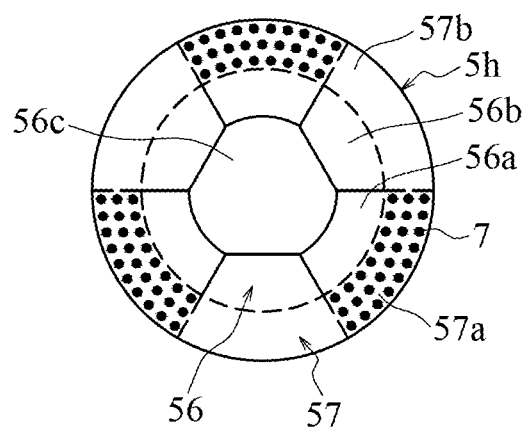
FIG. 9A is a schematic top view of the protrusive structures according to yet another embodiment of the present invention.
Figure 9B:
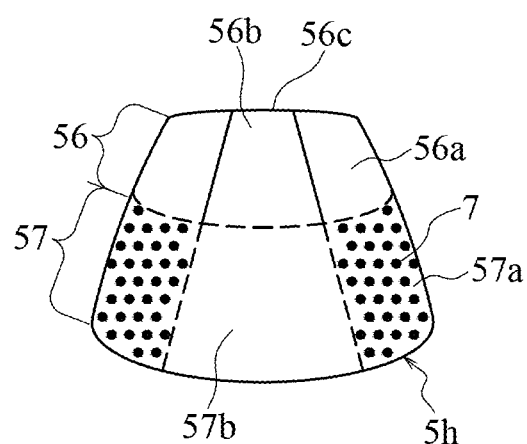
FIG. 9B is a schematic side view of the protrusive structures shown in FIG. 9A.

FIG. 9A is a schematic top view of the protrusive structures 5h according to yet another embodiment of the present invention. FIG. 9B is a schematic side view of the protrusive structures 5h shown in FIG. 9A. The protrusive structure 5h shown in FIGS. 9A and 9B is a modification of the protrusive structure 5g shown in FIGS. 8A and 8B and is distinguished by the upper portion 56 of the protrusive structure 5h. The upper portion 56 of the protrusive structure 5h for example is formed by alternatively arranging three third zones 56a and three fourth zones. The third zone 56a of the upper portion 56 corresponds to the first zone 57a of the lower portion 57 while the fourth zone 56b of the upper portion 56 corresponds to the second zone 57b of the lower portion 57. For example, in this embodiment the third zone 56a may be an arc surface while the fourth zone 56b may be a flat surface.

Figure 10A:
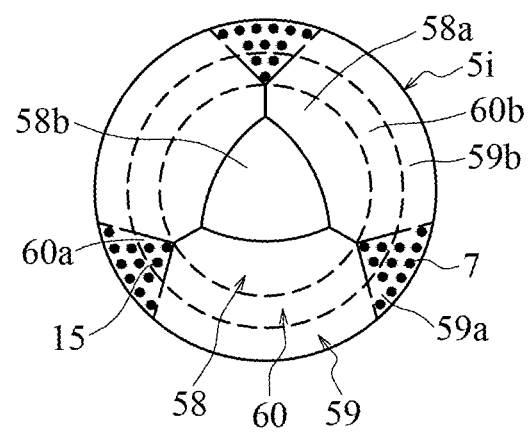
FIG. 10A is a schematic top view of the protrusive structures according to yet another embodiment of the present invention.
Figure 10B:
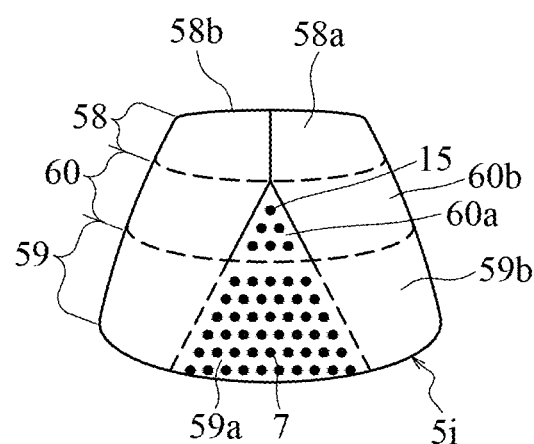
FIG. 10B is a schematic side view of the protrusive structures shown in FIG. 10A.

FIG. 10A is a schematic top view of the protrusive structures 5i according to one embodiment of the present invention. FIG. 10B is a schematic side view of the protrusive structures 5i shown in FIG. 10A. As shown in FIGS. 10A and 10B, the upper portion 58 of the protrusive structure 5i may comprise a truncated top surface 58b. The surface of the upper portion 58 may be a triangular pyramid surface. The surface of the lower portion 59 of the protrusive structure 5i may be a conical surface and comprise at least one first zone 59a and at least one second zone 59b alternatively arranged. The first zone 59a may comprise one or more first projections 7. Each of the protrusive structures 5i may further comprise an intermediate portion 60 between the upper portion 58 and the lower portion 59. The surface of the intermediate portion 60 is formed for example by alternatively arranging three fifth zones 60a and three sixth zones 60b. The fifth zone 60a of the intermediate portion 60 comprises one or more fourth projections 15 and corresponds to a first zone 59a of the lower portion 59 while the sixth zone 60b of the intermediate portion 60 corresponds to a second zone 59b of the lower portion 59. The triangular pyramid surface 58a may be connected to the sixth zone 60b of the intermediate portion 60.

One should understand that the dotted lines drawn in FIGS. 2A, 2B, 3A, 3B, 4, 5, 6A, 6B, 7A, 7B, 8A, 8B, 9A, 9B, 10A, and 10B are for illustrating purposes of different zones and are not limiting to the present invention.

Figure 11:
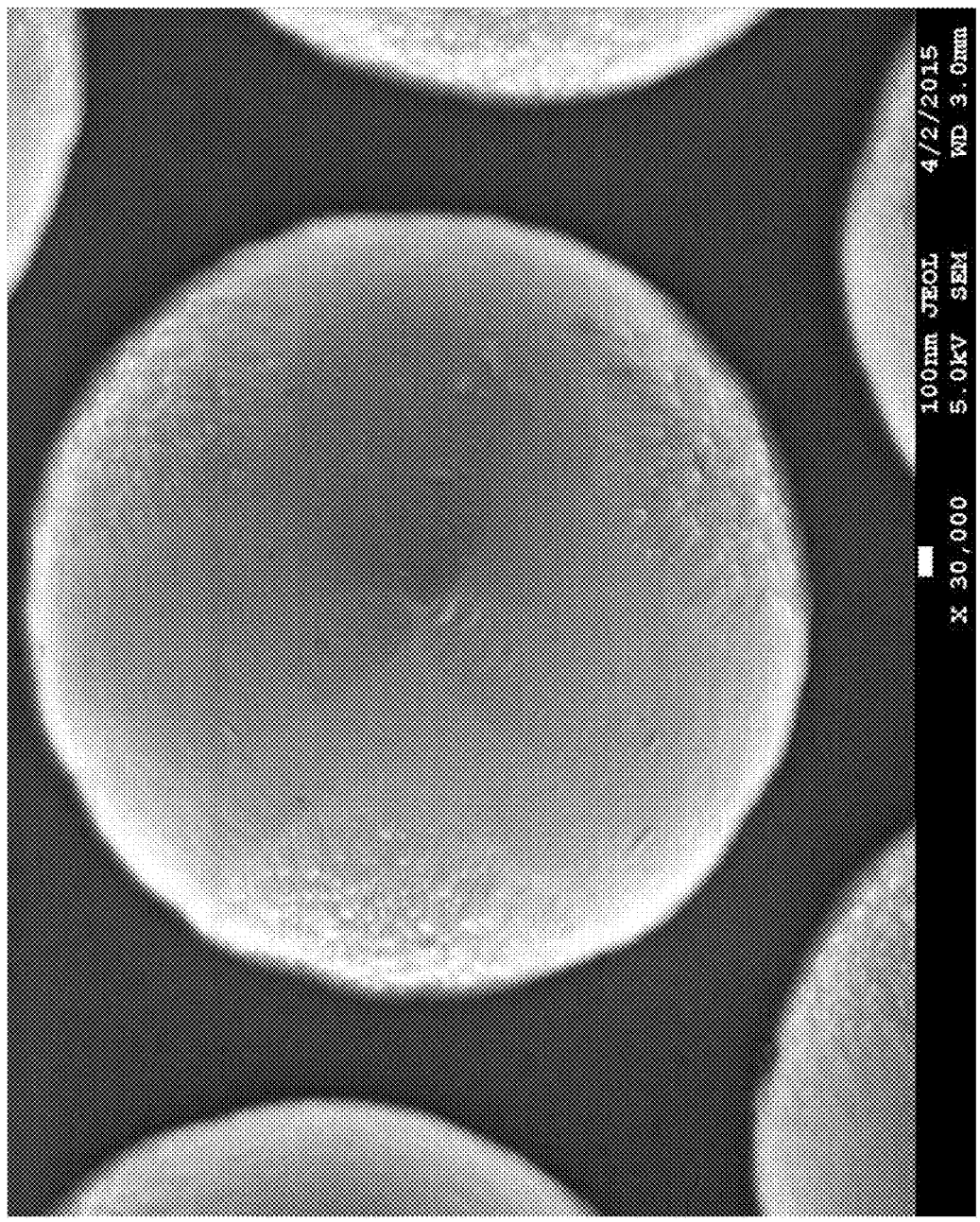
FIG. 11 is the scanning electronic microscopic image of the top view of the protrusive structures shown in FIG. 3A.
Figure 12:
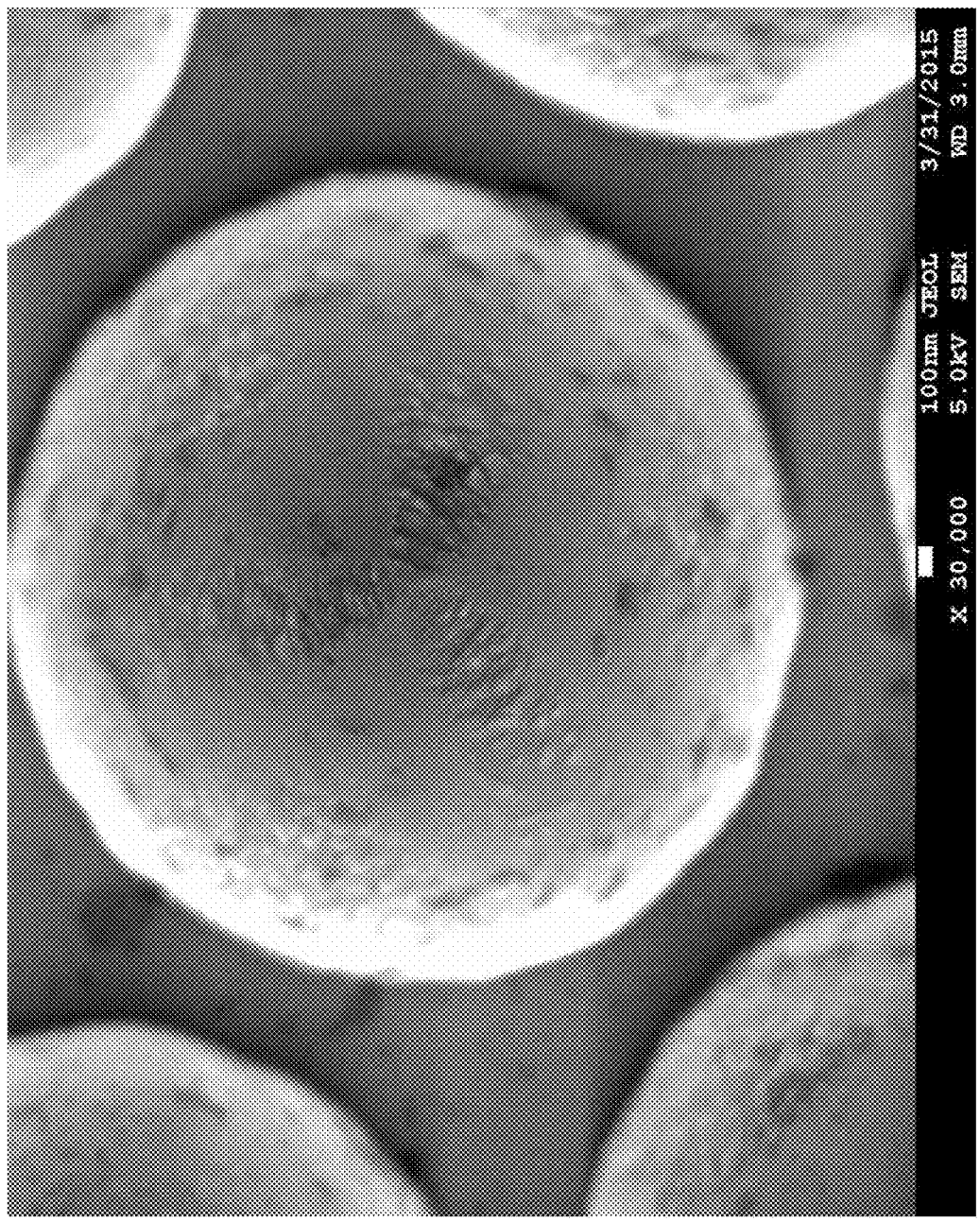
FIG. 12 is the scanning electronic microscopic image of the top view of the protrusive structures shown in FIG. 4.
Figure 13:
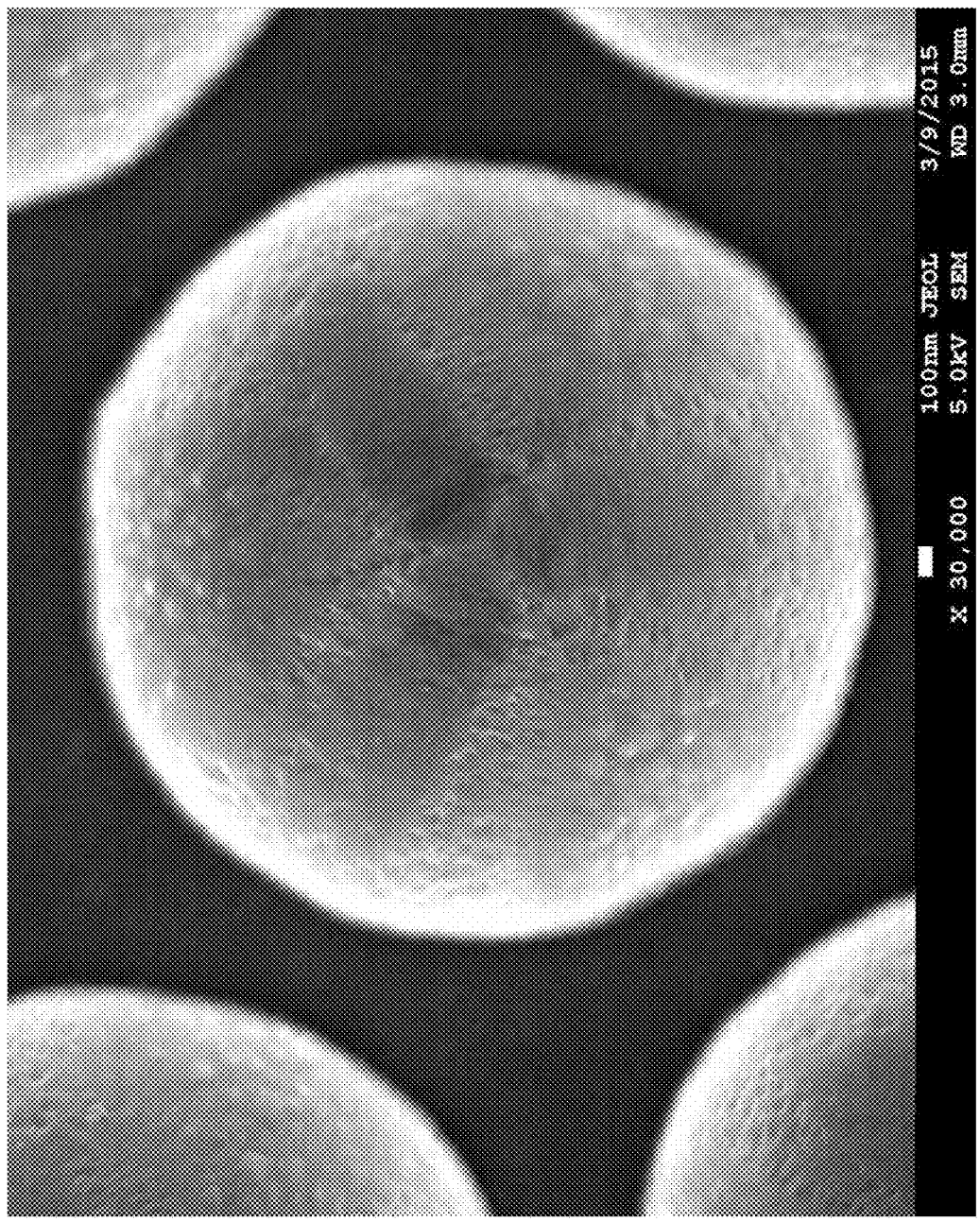
FIG. 13 is the scanning electronic microscopic image of the top view of the protrusive structures shown in FIG. 7A.

FIG. 11 is the scanning electronic microscopic image of the top view of the protrusive structures shown in FIG. 3A. FIG. 12 is the scanning electronic microscopic image of the top view of the protrusive structures shown in FIG. 4. FIG. 13 is the scanning electronic microscopic image of the top view of the protrusive structures shown in FIG. 7A.

In the embodiments of the present invention, the protrusive structures may be cone structure or truncated cone structure and they may also be pyramid structure, prism structure, hemisphere structure, etc. The cone structure or truncated cone structure may provide better process stability in a subsequent epitaxial growth process. In the present invention, the width of each protrusive structure may be between 2 μm and 3 μm while the height of each protrusive structure may be between 1 μm and 2 μm, but the present invention is not limited thereto. However, excessive height may cause troubles during the subsequent epitaxial growth. The width mentioned herein is defined as the diameter of the protrusive structure while the height mentioned herein is defined as the distance between the bottom and the top of the protrusive structure.

In the present invention, the conical surface of the lower portion is beneficial to the stability of a subsequent epitaxial growth. Furthermore, the first hole, the second hole, the third hole, the fourth hole, the first projection, the second projection, the third projection, and the fourth projection are capable of providing more scattering surfaces for helping the light emitted by the light emitting diode propagate to an external environment, thereby promoting light extraction efficiency of the light emitting diode. Moreover, light extraction efficiency of the light emitting diode may be further promoted by alternatively arranging zones with projections and zones without projections. Therefore, patterned substrates comprising for example the protrusive structures having arrangements as shown in FIGS. 2A-10B are better than conventional patterned substrates.

While the invention has been described in terms of what is presently considered to be the most preferred embodiments and the associated drawings, a person skilled in the art should understand that various modifications, changes, and equivalent alternatives can be made without departing from the spirit and scope of present invention. These modifications, changes, and equivalent alternatives fall in the scope of the present invention defined by the appended claims.

What is claimed is:

1. A patterned substrate for a light emitting diode comprising:
    a surface having a plurality of protrusive structures,
    wherein each of the protrusive structures comprises an upper portion and a lower portion, the lower portion being closer to the surface of the patterned substrate than the upper portion, a surface of the lower portion being a conical surface and having at least one first zone and at least one second zone, the first zone and the second zone being alternately arranged along a perimeter of the conical surface of the lower portion, the first zone having one or more first projections, and the second zone having no projections,
    wherein the first zone and the second zone have substantially equal zone sizes.

2. The patterned substrate for a light emitting diode of claim 1, wherein the first projection is circular with a diameter between 20 nm and 200 nm.

3. The patterned substrate for a light emitting diode of claim 1, wherein the surface of the upper portion is formed by alternatively arranging three third zones and three fourth zones along a perimeter of the surface of the upper portion, the conical surface of the lower portion is formed by alternatively arranging three first zones and three second zones along the perimeter of the conical surface of the lower portion, wherein the third zone of the upper portion corresponds to the first zone of the lower portion and the fourth zone of the upper portion corresponds to the second zone of the lower portion.

4. The patterned substrate for a light emitting diode of claim 3, wherein the fourth zone of the upper portion comprises one or more second projections.

5. The patterned substrate for a light emitting diode of claim 4, wherein the second projection is circular with a diameter between 20 nm and 200 nm.

6. The patterned substrate for a light emitting diode of claim 3, wherein the third zone has an arc surface and the fourth zone has a flat surface.

7. The patterned substrate for a light emitting diode of claim 3, wherein the second zone of the lower portion has one or more first holes and the third zone of the upper portion has one or more second holes.

8. The patterned substrate for a light emitting diode of claim 7, wherein widths of the first hole and the second hole are smaller than 0.2 μm.

9. The patterned substrate for a light emitting diode of claim 8, wherein the widths of the first hole and the second hole are between 10 nm and 100 nm.

10. The patterned substrate for a light emitting diode of claim 1, wherein a surface of the upper portion is a triangular pyramid surface, each of the protrusive structures further comprising an intermediate portion between the upper portion and the lower portion, the surface of the intermediate portion being formed by alternatively arranging three fifth zones and three sixth zones along a perimeter of the surface of the intermediate portion, the conical surface of the lower portion being formed by alternatively arranging three first zones and three second zones along the perimeter of the conical surface of the lower portion, wherein the fifth zone of the intermediate portion has one or more fourth projections and corresponds to the first zone of the lower portion and the sixth zone of the intermediate portion corresponds to the second zone of the lower portion.

11. The patterned substrate for a light emitting diode of claim 1, wherein a surface of the upper portion is a triangular pyramid surface and the second zone of the lower portion has one or more third holes, each of the protrusive structures further comprising an intermediate portion between the upper portion and the lower portion, the surface of the intermediate portion being formed by alternatively arranging three fifth zones and three sixth zones along a perimeter of the surface of the intermediate portion, the conical surface of the lower portion being formed by alternatively arranging three first zones and three second zones along the perimeter of the conical surface of the lower portion, wherein the fifth zone of the intermediate portion has one or more fourth holes and corresponds to the first zone of the lower portion and the sixth zone of the intermediate portion corresponds to the second zone of the lower portion.

12. The patterned substrate for a light emitting diode of claim 11, wherein widths of the third hole and the fourth hole are smaller than 0.2 μm.

13. The patterned substrate for a light emitting diode of claim 12, wherein the widths of the third hole and the fourth hole are between 10 nm and 100 nm.

14. The patterned substrate for a light emitting diode of claim 1, wherein the upper portion has a truncated top surface and a surface of the upper portion is a conical surface.

15. The patterned substrate for a light emitting diode of claim 1, wherein the upper portion has a truncated top surface and the upper portion is formed by alternatively arranging three third zones and three fourth zones along a perimeter of the surface of the upper portion, the conical surface of the lower portion being formed by alternatively arranging three first zones and three second zones along the perimeter of the conical surface of the lower portion, wherein the third zone of the upper portion corresponds to the first zone of the lower portion and the fourth zone of the upper portion corresponds to the second zone of the lower portion.

16. The patterned substrate for a light emitting diode of claim 15, wherein the third zone has an arc surface and the fourth zone has a flat surface.

17. The patterned substrate for a light emitting diode of claim 1, wherein the upper portion has a truncated top surface and a surface of the upper portion is a triangular pyramid surface, each of the protrusive structures further comprising an intermediate portion between the upper portion and the lower portion, the surface of the intermediate portion being formed by alternatively arranging three fifth zones and three sixth zones along a perimeter of the surface of the intermediate portion, the conical surface of the lower portion being formed by alternatively arranging three first zones and three second zones along the perimeter of the conical surface of the lower portion, wherein the fifth zone of the intermediate portion has one or more fourth projections and corresponds to the first zone of the lower portion and the sixth zone of the intermediate portion corresponds to the second zone of the lower portion.

18. The patterned substrate for a light emitting diode of claim 10, wherein the fourth projection has a circular perimeter with a diameter between 20 nm and 200 nm.

19. The patterned substrate for a light emitting diode of claim 17, wherein the fourth projection has a circular perimeter with a diameter between 20 nm and 200 nm.

* * * * *